(12) United States Patent
Li et al.

(10) Patent No.: US 9,742,152 B2
(45) Date of Patent: Aug. 22, 2017

(54) TUNABLE SEMICONDUCTOR LASER BASED ON RECONSTRUCTION-EQUIVALENT CHIRP AND SERIES MODE OR SERIES AND PARALLEL HYBRID INTEGRATION, AND PREPARATION THEREOF

(71) Applicant: NANJING UNIVERSITY SCIENCE PARK DEVELOPMENT CO., LTD., Jiangsu (CN)

(72) Inventors: Lianyan Li, Nanjing (CN); Song Tang, Nanjing (CN); Xiangfei Chen, Nanjing (CN); Yunshan Zhang, Nanjing (CN); Jun Lu, Nanjing (CN)

(73) Assignee: Nanjing University, Nanjing (CN)

( * ) Notice: Subject to any disclaimer, the term of this patent is extended or adjusted under 35 U.S.C. 154(b) by 0 days.

(21) Appl. No.: 14/903,740

(22) PCT Filed: Sep. 22, 2014

(86) PCT No.: PCT/CN2014/087035
§ 371 (c)(1),
(2) Date: Jan. 8, 2016

(87) PCT Pub. No.: WO2015/067099
PCT Pub. Date: May 14, 2015

(65) Prior Publication Data
US 2016/0134082 A1 May 12, 2016

(30) Foreign Application Priority Data

Nov. 8, 2013 (CN) .......................... 2013 1 0548888
Nov. 8, 2013 (CN) .......................... 2013 1 0548890

(51) Int. Cl.
*H01S 3/10* (2006.01)
*H01S 5/125* (2006.01)
(Continued)

(52) U.S. Cl.
CPC ............ *H01S 5/125* (2013.01); *H01S 5/0287* (2013.01); *H01S 5/0612* (2013.01);
(Continued)

(58) Field of Classification Search
CPC ...... H01S 5/0287; H01S 5/1212; H01S 3/139; H01S 5/0622; H01S 3/137
(Continued)

(56) References Cited

U.S. PATENT DOCUMENTS

| 5,309,457 A | 5/1994 | Minch |
| 2008/0025361 A1 | 1/2008 | Jerman et al. |
| 2012/0051386 A1* | 3/2012 | Kim ...................... H01S 5/1096 372/96 |

FOREIGN PATENT DOCUMENTS

| CN | 101369718 | * 2/2009 | ............... H01S 5/40 |
| CN | 200810156592 | 2/2009 | |

(Continued)

OTHER PUBLICATIONS

"Simple and compact V-cavity semiconductor laser with 50 x 100 GHz wavelength tuning," vol. 21, No. 11, Optics Express, 2013.
(Continued)

*Primary Examiner* — Tuan Nguyen
(74) *Attorney, Agent, or Firm* — Treasure IP Group, LLC

(57) ABSTRACT

A tunable distributed feedback (DFB) semiconductor laser based on a series mode or a series and parallel hybrid mode. A grating structure of the laser is a sampling Bragg grating based on the reconstruction-equivalent chirp technology. DFB lasers with different operating wavelengths based on the reconstruction-equivalent chirp technology are integrated together by a sampling series combination mode or a series/parallel hybrid mode, one of the lasers is selected to operate via a current, and the operating wavelength of the laser can be controlled by adjusting the current or the
(Continued)

1-1, N electrode; 1-2, InP substrate; 1-3, bottom SCH layer; 1-4, MQW; 1-5, upper SCH layer; 1-6, grating layer; 1-7, etch stop layer; 1-8, ridge waveguide; 1-9, SiO₂ layer; 1-10, P electrode; 1-11, isolation gap between DFB sections.

temperature, so that the continuous tuning of the operating wavelengths of the lasers can be realized. Various wavelength signals in parallel channels are coupled and then output from the same waveguide. An electrical isolation area (1-11) is adopted between lasers connected in series or lasers connected in series and connected in parallel to reduce the crosstalk between adjacent lasers.

11 Claims, 4 Drawing Sheets

(51) Int. Cl.
H01S 5/06 (2006.01)
H01S 5/40 (2006.01)
H01S 5/028 (2006.01)
H01S 5/10 (2006.01)
H01S 5/34 (2006.01)
H01S 5/343 (2006.01)
H01S 5/12 (2006.01)
H01S 5/026 (2006.01)

(52) U.S. Cl.
CPC .......... H01S 5/1096 (2013.01); H01S 5/1212 (2013.01); H01S 5/3403 (2013.01); H01S 5/3434 (2013.01); H01S 5/4006 (2013.01); H01S 5/4025 (2013.01); H01S 5/4087 (2013.01); H01S 5/026 (2013.01); H01S 5/1209 (2013.01); H01S 5/4012 (2013.01)

(58) Field of Classification Search
USPC ............ 257/116; 372/26, 50.12, 50.11
See application file for complete search history.

(56) References Cited

FOREIGN PATENT DOCUMENTS

| CN | 102474069 | | 5/2012 | |
|---|---|---|---|---|
| CN | 102651535 | * | 8/2012 | .............. H01S 5/22 |
| CN | 103956652 | | 7/2014 | |
| WO | 2007101394 | | 2/2007 | |

OTHER PUBLICATIONS

"Automated Optical Packaging Technology for 10 Gb/s Transceivers and its Application to a Low-Cost Full C-Band Tunable Transmitter," Intel Technology Journal, vol. 08, 101-114, 2004.
"Full C-Band External Cavity Wavelength Tunable Laser Using a Liquid-Crystal-Based Tunable Mirror," IEEE Phton. Tech. Lett., vol. 17, 681-683, 2005.
"Tunable Semiconductor Lasers: A Tutorial," J. Lightwave Technol., vol. 22, 193-202, 2004.
"Widely Tunable DS-DBR Laser With Monolithically Integrated SOA: Design and Performance," IEEE J. Select. Topics Quantum Electron., vol. 11, 149-156, 2005.
Jan-Olof Wesström, Stefan Hammerfeldt, Jens Buus, Robert Siljan, Reinhard Laroy, and Harry de Vries, "Design of a Widely Tunable Modulated Grating Y-branch Laser using the Additive Vernier Effect for Improved Super-Mode Selection"). IEEE 18th International Semiconductor Laser Conference, 2002.
"Wavelength-Selectable microarray light sources for S-, C-, and L-band WDM systems," IEEE Photon. Technol. Lett., vol. 15, 903-905, 2003.
Jingsi Li, Huan Wang, Xiangfei Chen, et.al, "Experimental demonstration of distributed feedback semiconductor lasers based on reconstruction-equivalent-chirp technology" , Optics Express, 2009, 17 (7): 5240-5245.
Yuechun Shi, Xiangfei Chen, et.al, "Experimental demonstration of eight-wavelength distributed feedback semiconductor laser array using equivalent phase shift", Optics Letters, 2012 37 (16), p. 3315-3317.

* cited by examiner

1-1, N electrode; 1-2, InP substrate; 1-3, bottom SCH layer; 1-4, MQW; 1-5, upper SCH layer; 1-6, grating layer; 1-7, etch stop layer; 1-8, ridge waveguide; 1-9, $SiO_2$ layer; 1-10, P electrode; 1-11, isolation gap between DFB sections.

2-1, one DFB section; 2-2, output direction.

3-1, N electrode; 3-2, InP substrate; 3-3, bottom SCH layer; 3-4, MQW; 3-5, upper SCH layer; 3-6, grating layer; 3-7, etch stop layer; 3-8, ridge waveguide; 3-9, $SiO_2$ layer; 3-10, P electrode; 3-11, isolation gap between DFB sections.

4-1, one DFB section; 4-2, wavelength multiplexer; 4-3 output direction.

US 9,742,152 B2

TUNABLE SEMICONDUCTOR LASER BASED ON RECONSTRUCTION-EQUIVALENT CHIRP AND SERIES MODE OR SERIES AND PARALLEL HYBRID INTEGRATION, AND PREPARATION THEREOF

CROSS REFERENCE TO RELATED APPLICATION

This application claims priority to a PCT application PCT/CN2014/087035, filed on Sep. 22, 2014, which in turn claims priority from two Chinese Application No. 201310548890.5, filed on Nov. 8, 2013, and Chinese Application No. 201310548888.8, filed on Nov. 8, 2013, The PCT application and Chinese Applications are incorporated herein by reference in their entireties.

TECHNICAL FIELD

The present invention relates to optical components for telecommunications and, more particularly, to the design and manufacture method of low-cost tunable distributed feedback (DFB) semiconductor lasers based on reconstruction equivalent chirp (REC) technique.

BACKGROUND OF THE INVENTION

During the last two decades, the increasing demand for communication bandwidth boosted the development of fiber-optical communications. A number of methods dedicated to increase the capacity and bandwidth are proposed, in which dense wavelength division multiplexing (DWDM) is attractive and has been exploited due to its flexibility to upgrade or reconstruct on the basis of existing infrastructures.

DWDM technology can be used to increase the transmission capacity of a system by increasing the number of wavelengths. For instance, 80 or 100 channels with different signals can be transmitted through a single fiber at the same time, and then can be separated when they reach the subscriber users. It considerably improves the efficiency of the transmission systems. In conventional DWDM systems, distributed feedback (DFB) semiconductor lasers are the major light sources. Multiple signals are required to be transmitted simultaneously, and the wavelength interval between the lasers has to meet the International Telecommunication Union (ITU-T) standards. If semiconductor lasers with specific wavelengths are used, each subscriber user has to be equipped with a specific transceiver, which is used to download multiple wavelength signals from the central office, and then demodulate signal as needed. In order to ensure the stability of the system, a backup for each transceiver has to be configured in case of the laser failure, so the energy consumption and maintenance costs are increased. Therefore, it is desirable to use tunable lasers in DWDM systems, and then only one tunable laser backup is needed, which can be used to replace any of the wavelengths, so the complexity of the DWDM systems and the running costs are greatly reduced.

For the tunable lasers used in the central office, high performances such as narrow linewidth, wide tuning range, high stability, good reliability in harsh environment, and long life time are needed. However, the required number of lasers is small, so it's not sensitive to the price. If the tunable lasers are used in access networks such as WDM-PON, each subscriber user has to be equipped with an optical transceiver, so a large amount of tunable lasers with very low price are needed. The target price of such an optical transceiver module is $ 50, normally does not exceed $ 100, but the current market price of the basic tunable lasers are more than $ 1,000. Accordingly, the present invention is to design and produce low-cost tunable lasers for the majority of WDM-PON market. Fast tuning speed is not required in WDM-PON systems, but the tuning range should be larger than 10 nm so as to cover multiple ITU-T 100 GHz channels.

In the 1980s, the research on tunable lasers has been started. A typical tunable laser comprises a gain region and a wavelength tunable filter, which are operated by changing the temperature, electric current, electric field, or by changing the wavelength mechanically. The structures of the tunable lasers can be divided into three major categories: external cavity laser, distributed Bragg reflector (DBR) laser, and distributed feedback (DFB) laser array. These lasers can be designed to achieve a tuning range of more than 40 nm, which can meet the requirements of DWDM systems, though they have their own advantages and disadvantages.

The performance of external cavity tunable laser is desirable. It can be continuously tuned over a wide wavelength range with high output power, and can obtain optical linewidth of less than 100 kHz. However, the packaging of the external cavity laser is complicated and costly, because the wavelength tuning component is complex.

The DBR tunable lasers are extensively studied, which use the vernier principle between two gratings to achieve a wide wavelength tuning range. The packaging of DBR laser is relatively simple comparing with the external cavity laser, but the fabrication of such a laser is difficult because the active and passive waveguide have to be integrated. So it is difficult to achieve large-scale industrial production, and therefore hinders the development of such kind of lasers. Furthermore, the wavelength of DBR lasers are tuned by adjusting the injection currents, so the tuning speed is fast but the linewidth is broadened.

The cost of DFB tunable lasers is relatively cheap, but the tuning range is small (eg. 3 nm), because the refractive index of the active material changes slowly with temperature or current. Therefore, several wavelength specific DFB lasers are used to form a DFB laser array in order to increase the tuning range. The advantages of this approach are: the performance is very stable; there is no mode hoping; the packaging and wavelength tuning configuration are relatively simple.

The researchers in China have also studied the tunable lasers in depth. For example, Professor He Jianjun's group at Zhejiang University proposed a low-cost V-shaped coupling cavity widely tunable semiconductor laser ("Simple and compact V-cavity semiconductor laser with 50×100 GHz wavelength tuning", Vol. 21, No. 11, Optics Express, 2013). It has 50 channels with 100 GHz wavelength spacing covering the entire C-band.

More specifically, the external tunable lasers can be referred to the research results of Intel ("Automated Optical Packaging Technology for 10 Gb/s Transceivers and its Application to a Low-Cost Full C-Band Tunable Transmitter," Intel Technology Journal, vol. 08, 101-114, 2004.) and NEC ("Full C-Band External Cavity Wavelength Tunable Laser Using a Liquid-Crystal-Based Tunable Mirror," IEEE Phton. Tech. Lett., vol. 17, 681-683, 2005.). The DBR lasers can be referred to the research results of JDSU ("Tunable Semiconductor Lasers: A Tutorial," J. Lightwave Technol., vol. 22, 193-202, 2004.), Oclaro ("Widely Tunable DS-DBR Laser With Monolithically Integrated SOA: Design and Performance," IEEE J. Select. Topics Quantum Electron., vol. 11, 149-156, 2005.), and Syntune (Jan-Olof Wesström, Stefan Hammerfeldt, Jens Buus, Robert Siljan, Reinhard Laroy, and Harry de Vries, "Design of a Widely Tunable Modulated Grating Y-branch Laser using the Additive Vernier Effect for Improved Super-Mode Selection"). The DFB laser arrays can be referred to the research result of NEC ("Wavelength-Selectable microarray light sources for S-, C-, and L-band WDM systems," IEEE Photon. Technol. Lett., vol. 15, 903-905, 2003.). It covers the S, C and L communication bands with six eight-wavelength DFB laser arrays.

However, the realization of lasers with different wavelengths on the same chip is not easy. The traditional method is using electron beam lithography (EBL) to fabricate different gratings. However, the EBL costs high, and it's time consuming. In addition, due to the limited writing field of EBL, it's not suitable to fabricate devices in a large area. To solve these problems, Professor Xianfei Chen at Nanjing University filed an international PCT patent (Application No. PCT/CN2007/000601). Holographic exposure and conventional photolithographic are used to fabricate the Bragg gratings, so the DFB lasers with different lasing wavelengths can be fabricated on the same wafer, which greatly reduces the fabrication time and is easy to implement large scale production, thereby further reduces the overall cost. Some research results concerning the REC technique details and DFB lasers and laser arrays can be found in Chinese invention patent "Method and apparatus for manufacturing monolithic semiconductor laser array" (CN200810156592.0) and the literature: Jingsi Li, Huan Wang, Xiangfei Chen, et. al, "Experimental demonstration of distributed feedback semiconductor lasers based on reconstruction-equivalent-chirp technology", Optics Express, 2009, 17 (7): 5240-5245, and Yuechun Shi, Xiangfei Chen, et. al, "Experimental demonstration of eight-wavelength distributed feedback semiconductor laser array using equivalent phase shift", Optics Letters, 2012 37 (16), p 3315-3317.

The present invention provides series and hybrid series/parallel integration approaches to design and fabricate tunable DFB lasers based on REC technique. The wavelength tuning is achieved by changing the temperature and the injection currents.

SUMMARY OF THE INVENTION

The object of the present invention is to provide a method by which low-cost tunable lasers can be fabricated by holographic exposure combining with conventional photolithography. Two approaches are proposed: series configuration and hybrid series/parallel configuration. These kinds of tunable lasers can be used in WDM-PON optical communication systems.

One exemplary embodiment of the present invention is a tunable laser comprising of six DFB sections with different lasing wavelengths and a semiconductor optical amplifier (SOA) section. Each DFB sections are designed based on the REC technique, so the wavelength can be well controlled. The wavelength of each DFB section is tuned by changing the temperature or the injection currents. There is one DFB section working at one time, and the currents for the other non-working sections are applied at the transparency current to avoid absorption. The tuning range of each DFB section is around 3 nm. The wavelength spacing is designed to be the tuning range of each DFB section, so the tuning range of the laser is around 18 nm. It has a SOA section to amplify or attenuate the optical signal in order to keep the output power uniform. The electrical signals can be modulated on the SOA section. The DFB sections and the SOA section share the same waveguide, so there is no need for the multiplexer, which simplifies the fabrication and packaging of the transceiver module.

In an alternative exemplary embodiment, the present invention provides a method to reduce the fabrication and packaging difficulties which are caused by the long laser cavity if too many DFB sections are integrated in series. Because the laser material is brittle, the laser bar is fragile when the laser cavity is very long. Therefore, two or more branches with several (four for example) DFB sections on each branch can be coupled by a Y-branch or multimode interference (MMI) structure, and it is called as a hybrid series/parallel approach. The Y-branch or MMI structure has current injection to avoid the absorption and to balance the output power. A SOA section is integrated to the output port of the Y-branch or MMI structure.

Any of the exemplary embodiments of the present invention are based on REC technique, which has been filed a patent (PCT/CN2007/000601). The gratings in the tunable laser are sampled Bragg gratings (SBGs), which have equivalent gratings corresponding to ordinary Bragg gratings. The position of the equivalent phase shift locates within +/−10% of the single cavity length away from the middle of the SBG. The lasing wavelength of each DFB section locates in the bandwidth of the equivalent grating. The laser has anti-reflection coating (reflectivity between $10^{-5}$ and 10%) on both facets of the cavity. Each DFB section can be regarded as a separate AR/AR coated laser. The number of the DFB section in series is between 2 and 20, and the number of branches in parallel is between 2 and 50. The wavelength spacing between DFB sections is larger than 1 nm and smaller than 5 nm. The space (2 um~50 um) between two DFB sections can be fabricated by etching the InGaAs contact layer, implanting ions and covering with 100 nm~300 nm $SiO_2$ dielectric materials. The gratings in the tunable laser can be side wall gratings.

It is to be understood that both the foregoing general description and the following detailed description are merely exemplary and explanatory, and are not restrictive, of the present invention.

BRIEF DESCRIPTION OF THE DRAWINGS

The invention can be best understood from the following description when read together with the features in the drawing. The features are not to scale according to common practice, and the dimensions are expanded or reduced for clarity.

101, N electrode; 102, InP substrate; 103, bottom SCH layer; 104, MQW; 105, upper SCH layer; 106, grating layer; 107, etch stop layer; 108, ridge waveguide; 109, $SiO_2$ layer; 110, P electrode; 111, DFB sections; 112, SOA section.

Figure 2:
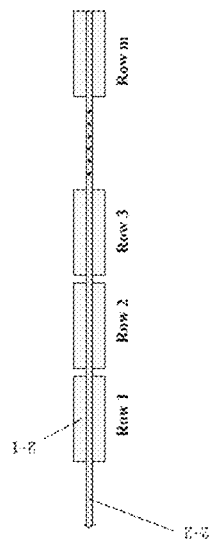
Figure 3:
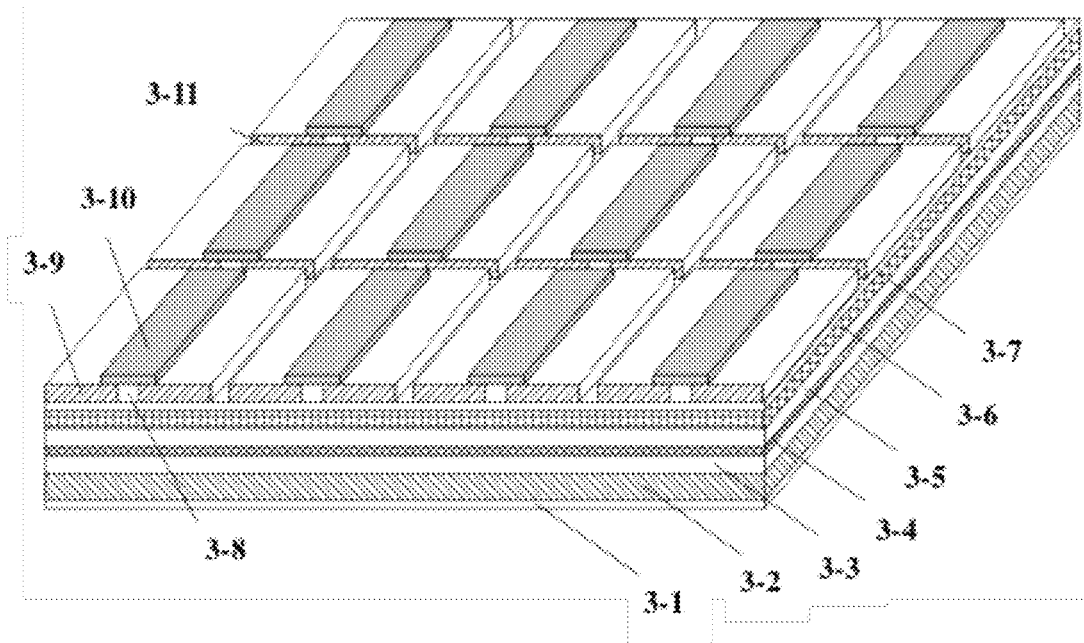
Figure 4:
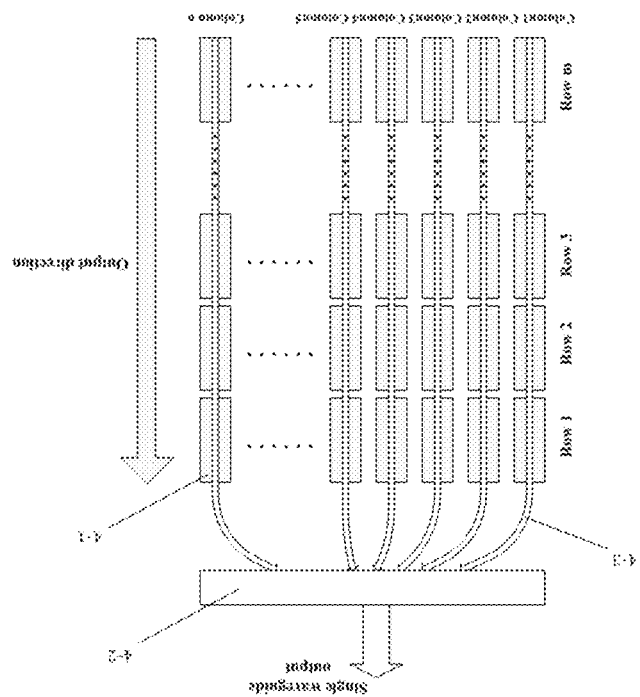

FIG. 2 is the schematic diagram of a tunable DFB laser in hybrid series/parallel configuration

201, N electrode; 202, InP substrate; 203, bottom SCH layer; 204, MQW; 205, upper SCH layer; 206, grating layer; 207, etch stop layer; 208, ridge waveguide; 209, $SiO_2$ layer; 210, P electrode; 211, DFB sections; 212, Y-branch or MMI structure; 213, SOA section.

DETAIL DESCRIPTION OF THE INVENTION

The present invention provides series or series/parallel configurations to design and fabricate low-cost tunable DFB semiconductor lasers based on REC technique.

Figure 1:
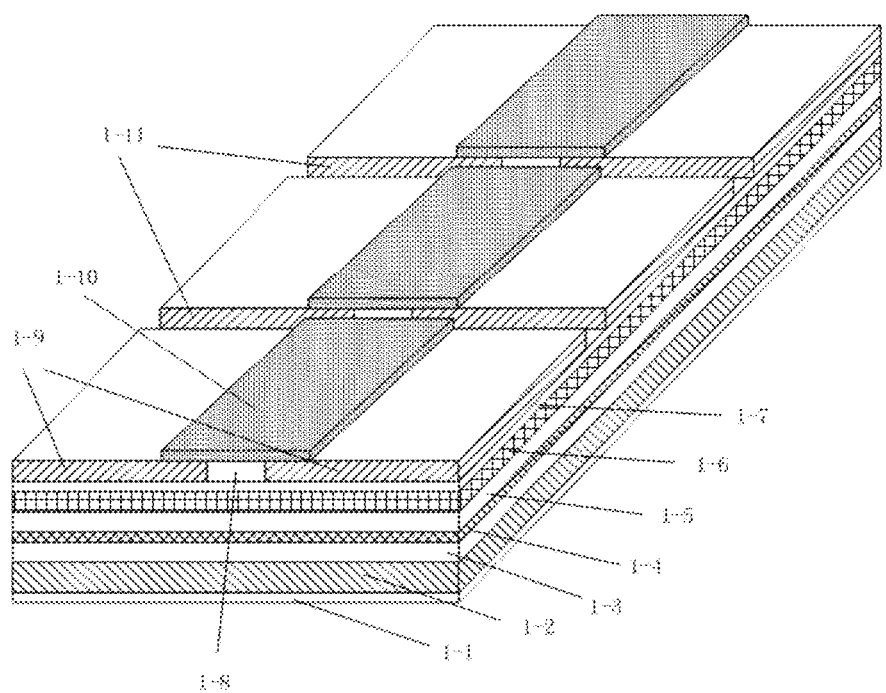
FIG. 1 is the schematic diagram of a tunable DFB laser in series configuration

First Embodiment: Tunable DFB Semiconductor Laser Based on REC Technique and Series Configuration Working in 1550 nm Window As shown in FIG. 1, the epitaxy is grown on an n-type InP (100) substrate by metal organic vapor phase epitaxy (MOVPE). The first growth comprises of a 200 nm n-type InP buffer layer, a 100 nm lattice-matched InGaAsP waveguide layer, strained InGaAsP multiple-quantum-well (MQW) layers with photoluminescence wavelength of 1.53 um, and a 70 nm InGaAsP grating layer. Then uniform grating are fabricated on the grating layer, after which the sampling patterns are transferred to the grating by conventional photolithography. Then in the second growth step, a 100 nm p-type lattice-matched InGaAsP waveguide layer, a 1.7 um p-type InP layer and a 100 nm p-type InGaAs contact layer are grown successively. Then the contact layer in the isolation region between two DFB sections is removed and ion implanting is performed. After that, the ridge waveguide is patterned and a 200 nm SiO$_2$ layer is deposited by plasma-enhanced chemical vapor deposition (PECVD). Then the SiO$_2$ on the ridge waveguide is removed and the contacts are fabricated. Both facets of the laser cavity have anti-reflection coatings with reflectivity of less than 1%. The laser has six DFB sections and one SOA section. The length of each DFB section is 400 um, the length of the SOA section is 300 um, and the space between two sections is 50 um. The total length of the tunable laser is 3 mm. The tuning range of each DFB section is 3.2 nm, so the tuning range of the laser is around 19.2 nm. The temperature changes from 15° C. to 50° C. for continuous wavelength tuning. The threshold current of each DFB section is around 30 mA, and the side mode suppression ratios are above 42 dB.

Second Embodiment: Tunable DFB Semiconductor Laser Based on REC Technique and Series/Parallel Configuration Working in 1550 nm Window As shown in FIG. 2, the epitaxy is grown on an n-type InP (100) substrate by metal organic vapor phase epitaxy (MOVPE). The first growth comprises of a 200 nm n-type InP buffer layer, a 100 nm lattice-matched InGaAsP waveguide layer, strained InGaAsP multiple-quantum-well (MQW) layers with photoluminescence wavelength of 1.53 um, and a 70 nm InGaAsP grating layer. Then uniform grating are fabricated on the grating layer, after which the sampling patterns are transferred to the grating by conventional photolithography. Then in the second growth step, a 100 nm p-type lattice-matched InGaAsP waveguide layer, a 1.7 um p-type InP layer and a 100 nm p-type InGaAs contact layer are grown successively. Then the contact layer in the isolation region between two DFB sections is removed and ion implanting is performed. After that, the ridge waveguide is patterned and a 200 nm SiO$_2$ layer is deposited by plasma-enhanced chemical vapor deposition (PECVD). The waveguide of the Y-branch or MMI structure is fabricated together with the ridge waveguide of the laser sections. Then the SiO$_2$ on the ridge waveguide is removed and the contacts are fabricated. Both facets of the laser cavity have anti-reflection coatings with reflectivity of less than 1%. The laser has four branches with four DFB sections on each branch and one SOA section. The light from different branches is coupled by Y-branch (for lasers with two branches) or MIMI structure (for lasers with more branches). The lengths of each DFB section, the MIMI section, and the SOA section are 400 um, 600 um, and 300 um. The space between two sections is 50 um. The total length of the tunable laser is 2.65 mm. The tuning range of each DFB section is 3.2 nm, so the tuning range of the laser is around 51.2 nm. The temperature changes from 15° C. to 50° C. for continuous wavelength tuning. The threshold current of each DFB section is around 30 mA, and the side mode suppression ratios are above 42 dB.

While the invention has been described in terms of exemplary embodiments, it is contemplated that it may be practiced, as outlined above, but includes all modifications coming within the scope of the following claims.

We claim:

1. A tunable distributed feedback (DFB) semiconductor laser in series or series/parallel hybrid configurations, and a grating of each of plurality DFB sections being a sampled Bragg grating based on reconstruction-equivalent chirp (REC) technique, wherein a DFB laser section of a plurality DFB laser sections with different wavelengths are designed based on the REC technique, and integrated together as a tunable device in series or series/parallel hybrid configuration, the DFB laser section is controlled by current injection, and the wavelength tuning is realized by changing temperature, so the tunable DFB semiconductor laser has continuous wavelength tuning, when in series/parallel hybrid configuration all of the wavelengths from the parallel branches are coupled together by a wavelength multiplexer and output from a single output waveguide, wherein each of the plurality DFB laser sections are electrically isolated from each other by an isolation gap, so that each DFB laser section can be controlled independently;

the sampled Bragg grating in each of the plurality DFB laser sections are designed and fabricated by equivalent chirp or equivalent phase shift technique, and the equivalent phase shift locates within ±40% around the center of the sampled Bragg grating;

the sampled Bragg grating is fabricated on a side wall of an InP ridge waveguide layer as a side wall grating.

2. The tunable DFB semiconductor laser in series or series/parallel hybrid configuration according to claim 1, wherein the number of plurality DFB laser sections in series is from 2 to 20; and the plurality DFB laser sections in series/parallel hybrid configuration based on REC technique is m×n, where 2≤m≤20, 2≤n≤50;

a wavelength spacing of the isolation gap between each of the plurality DFB laser sections is between 1 nm to 5 nm, and the tunable DFB semiconductor laser has 60 nm continuous tuning range.

3. The tunable DFB semiconductor laser in series or series/parallel hybrid configuration according to claim 1, wherein both end facets of each of the plurality DFB laser sections formed a laser cavity have anti-reflection coatings with reflectivity between $10^{-5}$ and 10%.

4. A manufacture method of making the tunable DFB semiconductor laser in series or series/parallel hybrid configuration according to claim 1, comprising making the isolation gap between the plurality DFB laser sections by removing an InGaAsP ohmic contact layer and the InP ridge waveguide layer, and then covering the InP ridge waveguide layer with 100 nm~300 nm $SiO_2$ wherein a length of the isolation gap is between 5 μm and 80 μm.

5. The manufacture method of the tunable DFB semiconductor laser in series or series/parallel hybrid configuration according to claim 4, wherein each DFB laser section is designed and fabricated based on equivalent phase shift technique, and the equivalent phase shift locates within ±40% around the center of the sampled Bragg grating.

6. The manufacture method of the tunable DFB semiconductor laser in series or series/parallel hybrid configuration according to claim 4, wherein the sampled Bragg grating is fabricated on the side wall of the ridge waveguide.

7. The manufacture method of the tunable DFB semiconductor laser in series or series/parallel hybrid configuration according to claim 4, wherein both end facets of each of the plurality DFB laser sections formed a laser cavity have anti-reflection coatings with reflectivity between $10^{-5}$ and 10%.

8. A manufacture method of making the tunable DFB semiconductor laser in series or series/parallel hybrid configuration according to claim 1, comprising making the isolation gap between the plurality DFB laser sections by removing an InGaAsP ohmic contact layer and implanting ion, and then covering the InP ridge waveguide layer with 100 nm~300 nm $SiO_2$ wherein a length of the isolation gap is between 2 μm and 15 μm.

9. The manufacture method of the tunable DFB semiconductor laser in series or series/parallel hybrid configuration according to claim 8, wherein each DFB section is designed and fabricated based on equivalent phase shift technique, and the equivalent phase shift locates within ±40% around the center of the sampled Bragg grating.

10. The manufacture method of the tunable DFB semiconductor laser in series or series/parallel hybrid configuration according to claim 8, wherein the sampled Bragg grating is fabricated on the side wall of the ridge waveguide.

11. The manufacture method of the tunable DFB semiconductor laser in series or series/parallel hybrid configuration according to claim 8, wherein both end facets of each of the plurality DFB laser sections formed a laser cavity have anti-reflection coatings with reflectivity between $10^{-5}$ and 10%.

* * * * *